United States Patent
Xiao et al.

(10) Patent No.: US 9,373,674 B2
(45) Date of Patent: Jun. 21, 2016

(54) SANDWICH DAMASCENE RESISTOR

(71) Applicant: GLOBALFOUNDRIES Singapore Pte. Ltd., Singapore (SG)

(72) Inventors: Chang Yong Xiao, Mechanicville, NY (US); Roderick Miller, Mechanicville, NY (US); Jie Chen, Mechanicville, NY (US)

(73) Assignee: GLOBALFOUNDRIES SINGAPORE PTE.LTD., Singapore (SG)

( * ) Notice: Subject to any disclaimer, the term of this patent is extended or adjusted under 35 U.S.C. 154(b) by 0 days.

(21) Appl. No.: 14/639,524

(22) Filed: Mar. 5, 2015

(65) Prior Publication Data

US 2015/0179729 A1    Jun. 25, 2015

Related U.S. Application Data

(62) Division of application No. 13/738,604, filed on Jan. 10, 2013, now Pat. No. 9,012,293.

(51) Int. Cl.
| | |
|---|---|
| *H01L 27/06* | (2006.01) |
| *H01L 27/08* | (2006.01) |
| *H01L 49/02* | (2006.01) |
| *H01L 23/522* | (2006.01) |

(52) U.S. Cl.
CPC ............ *H01L 28/24* (2013.01); *H01L 23/5228* (2013.01); *H01L 27/0629* (2013.01); *H01L 28/20* (2013.01); *H01L 28/22* (2013.01); *H01L 2924/0002* (2013.01)

(58) Field of Classification Search
CPC ..... H01L 28/20; H01L 28/24; H01L 27/0629; H01L 23/5228
USPC .................................................. 257/379, 536
See application file for complete search history.

(56) References Cited

U.S. PATENT DOCUMENTS

| | | | | |
|---|---|---|---|---|
| 6,709,918 B1* | 3/2004 | Ng | ...................... | H01L 23/5223 257/E21.004 |
| 2006/0145296 A1* | 7/2006 | Coolbaugh | ............. | H01L 28/20 257/536 |
| 2007/0040239 A1* | 2/2007 | Chinthakindi | ...... | H01L 23/5228 257/536 |
| 2009/0140387 A1* | 6/2009 | Yang | .................... | H01L 23/5228 257/536 |
| 2010/0181627 A1* | 7/2010 | Willmeroth | ............. | H01L 24/03 257/379 |
| 2012/0118619 A1* | 5/2012 | Booth, Jr. | .......... | H01L 21/31116 174/257 |
| 2013/0049924 A1 | 2/2013 | Yang et al. | | |
| 2013/0093024 A1* | 4/2013 | Eshun | ..................... | H01L 28/20 257/379 |
| 2013/0119480 A1 | 5/2013 | Wong et al. | | |

* cited by examiner

*Primary Examiner* — Moazzam Hossain
(74) *Attorney, Agent, or Firm* — Ditthavong & Steiner, P.C.

(57) ABSTRACT

A method is provided for forming sandwich damascene resistors in MOL processes and the resulting devices. Embodiments include forming on a substrate a film stack including an interlayer dielectric (ILD), a first dielectric layer, and a sacrifice layer (SL); removing a portion of the SL and the first dielectric layer, forming a first cavity; conformally forming a layer of resistive material in the first cavity and over the SL; depositing a second dielectric layer over the layer of resistive material and filling the first cavity; and removing the second dielectric layer, the layer of resistive material not in the first cavity, and at least a partial depth of the SL

12 Claims, 15 Drawing Sheets

SANDWICH DAMASCENE RESISTOR

CROSS REFERENCE TO RELATED APPLICATION

This application is a Divisional of U.S. patent application Ser. No. 13/738,604, filed Jan. 10, 2013, the content of which is incorporated herein by reference in its entirety.

TECHNICAL FIELD

The present disclosure relates to semiconductor devices with integrated resistor structures. The present disclosure is particularly applicable to 20 nanometer (nm) and 22 nm technology nodes and beyond.

BACKGROUND

With the move to replacement metal gate (RMG) technologies, the traditional polysilicon resistor has become difficult and expensive to integrate with semiconductor devices and even more difficult to achieve precision resistor requirements. One solution is to integrate into a middle-of-the-line (MOL) process a thin film metal resistor contacted by a source/drain contact (CA) or a gate contact (CB) using a metal deposition, lithography, and etch process. However, the integration of a thin film metal resistor can be a challenge due to the tight tungsten (W) CA/CB chemical mechanical polishing (CMP) margin and the impacts of CMP on the thin film metal resistor.

A need therefore exists for methodology for integrating a sandwich damascene resistor in MOL processes, and the resulting product.

SUMMARY

An aspect of the present disclosure is a method of forming sandwich damascene resistors in MOL process.

Another aspect of the present disclosure is a device including a sandwich damascene resistor.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming on a substrate a film stack including an interlayer dielectric (ILD), a first dielectric layer, and a sacrifice layer (SL); removing a portion of the SL and the first dielectric layer, forming a first cavity; conformally forming a layer of resistive material in the first cavity and over the SL; depositing a second dielectric layer over the layer of resistive material and filling the first cavity; and removing the second dielectric layer, the layer of resistive material not in the first cavity, and at least a partial depth of the SL.

Aspects of the present disclosure include forming an RMG on the substrate in the ILD prior to forming the first dielectric layer. Further aspects include removing the portion of the SL and the first dielectric layer by damascene etching. Additional aspects include forming one of the SL and the first dielectric layer of oxide and the other of the SL and the first dielectric layer of nitride. Further aspects include forming the first dielectric layer to a thickness of 30 nm to 50 nm and forming the SL layer to a thickness of 20 nm to 40 nm. Another aspect includes forming the layer of resistive material to a thickness of 10 nm to 25 nm. Other aspects include removing the entire depth of the SL; forming a second SL over the first dielectric layer, subsequent to removing the first SL; removing a portion of the second SL and the first dielectric layer, forming a second cavity; conformally forming a layer of second resistive material in the second cavity and over the second SL; depositing a third dielectric layer over the layer of second resistive material and filling the second cavity; and removing the third dielectric layer and the layer of second resistive material not in the second cavity and the second SL. Further aspects include forming the SL to a thickness of 30 nm to 50 nm; removing a partial depth of the SL, leaving a thickness of a 20 nm to 30 nm; removing a second portion of the SL and the first dielectric layer, forming a second cavity subsequent to removing the partial depth of the SL; conformally forming a layer of second resistive material in the second cavity and over the SL; depositing a third dielectric layer over the layer of second resistive material and filling the second cavity; and removing the third dielectric layer, the second dielectric layer, the SL, the layer of the first resistive material, and the layer of second resistive material down to the upper surface of the first dielectric layer. Additional aspects include forming the layer of resistive material of tantalum silicon nitride (TaSiN$_x$), polysilicon (doped or undoped), titanium nitride (TiN), tantalum nitride (TaN), tungsten silicide (WSi$_x$), nickel-chromium (NiCr), titanium oxynitride (TiNxOy), ruthenium monoxide (RuO)/TaN stack, tantalum carbonitride (TaCxNy), tantalum silicon carbide (TaSiC), silicon carbide (SiC), chromium silicide (CrSi2), chromium silicon monoxide (CrSiO), or chromium-silicon-nitrogen (CrxSiyNz). Further aspects include forming the second dielectric layer of an oxide or a nitride. Another aspect includes removing the second dielectric layer, the layer of resistive material, and at least a partial depth of the SL, by CMP. Other aspects include forming a fourth dielectric layer over the entire substrate; and forming contacts through the fourth dielectric layer, the second dielectric layer, and/or the third dielectric layer down to the layer of resistive material.

Another aspect of the present disclosure is a device including a substrate; an ILD on the substrate; a first dielectric layer on the ILD; a first cavity formed in the first dielectric layer; a layer of resistive material lining the first cavity; and a second dielectric layer filling the first cavity. Aspects of the device include at least one RMG on the substrate in the ILD. Other aspects include the first dielectric layer formed of an oxide or a nitride. Further aspects include the first dielectric layer formed to a thickness of 30 nm to 50 nm. Another aspect includes the layer of resistive material formed to a thickness of 10 nm to 25 nm. Other aspects include the device including a second cavity formed in the first dielectric layer; a layer of second resistive material lining the second cavity; and a third dielectric layer filling the second cavity. Further aspects include the layer of resistive material formed of TaSiN$_x$, polysilicon (doped or undoped), TiN, TaN, WSi$_x$, NiCr, TiNxOy, RuO/TaN stack, TaCxNy, TaSiC, SiC, CrSi2, CrSiO, or CrxSiyNz.

Another aspect of the present disclosure is a method including: forming at least one pair of source/drain regions in a substrate; forming an ILD on the substrate; forming a RMG on the substrate in the ILD between each pair of source/drain regions; forming on the ILD and RMGs a first dielectric layer and a first SL; etching a portion of the first SL and first dielectric layer, forming a first cavity; conformally depositing a layer of first resistive material over the first SL and in the first cavity; depositing a second dielectric layer over the layer of first resistive material and filling the first cavity; planarizing the second dielectric layer, the layer of first resistive material, and the first SL down to an upper surface of the first dielectric layer; forming a second SL; etching a portion of the second SL and the first dielectric layer, forming a second cavity; conformally forming a layer of second resistive material over the second SL and in the second cavity; forming a third dielectric layer over the layer of second resistive material and filling the second cavity; planarizing the third dielectric layer, the layer of second resistive material, and the second SL down to the upper surface of the first dielectric layer; forming a fourth dielectric layer over the entire substrate; and forming contacts through the fourth dielectric layer and through the second and third dielectric layers to the layer of first resistive material and the layer of second resistive material, respectively, forming source/drain contacts through the fourth dielectric layer to the source/drain regions, and forming gate contacts through the fourth dielectric layer to the RMGs.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 6A through 10A illustrate a process flow of forming sandwich damascene hybrid-resistors with the entire depth of a sacrifice layer removed, in accordance with an exemplary embodiment of the present disclosure; and FIGS. 6B through 10B illustrate a process flow of forming sandwich damascene hybrid-resistors with a partial depth of a sacrifice layer removed, in accordance with an exemplary embodiment of the present disclosure.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of a tight CMP margin at W CA/CB CMP attendant upon integrating resistors in semiconductor devices. In accordance with exemplary embodiments, metal sandwich damascene mono-resistors or metal sandwich damascene hybrid-resistors can easily be integrated into current MOL processes, do not suffer from a tight CMP margin at W CA/CB CMP, meet precision resistor requirements, i.e., the resistance of the sandwich is almost free from the impacts of CMP, and the sandwich film structure enables easy trench depth control, easy etch selectivity, and lower etch macro loading.

Methodology in accordance with embodiments of the present disclosure includes forming on a substrate a film stack including an ILD, a first dielectric layer, and a SL. A portion of the SL and the first dielectric layer is removed, forming a first cavity. A layer of resistive material is conformally formed in the first cavity and over the SL, and a second dielectric layer is deposited over the layer of resistive material and filling the first cavity. The second dielectric layer, the layer of resistive material not in the first cavity, and at least a partial depth of the SL are then removed.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1 through 5 illustrate a process flow for forming a semiconductor device with a sandwich damascene mono-resistor, in accordance with an exemplary embodiment. Adverting to FIG. 1, an ILD 103 of silicon dioxide ($SiO_2$) or nitride is formed on a substrate 101, which includes at least one pair of source/drain regions 105 on the substrate and shallow trench isolation regions 107 in the substrate. RMGs 109 are then formed between spacers 110 on the substrate, separated by the source/drain regions 105. A first dielectric layer 111 of oxide or nitride is then formed to a thickness of 30 nm to 50 nm over the RMGs 109 and the ILD 103, and a trench silicide 113 is formed through the first dielectric layer 111 down to each source/drain region 105. A sacrifice layer (SL) 115 of oxide, if the first dielectric layer 111 is nitride, and of nitride, if the first dielectric layer 111 is oxide, is then formed to a thickness of 20 nm to 40 nm over the first dielectric layer 111 and trench silicide 113.

Figure 1:
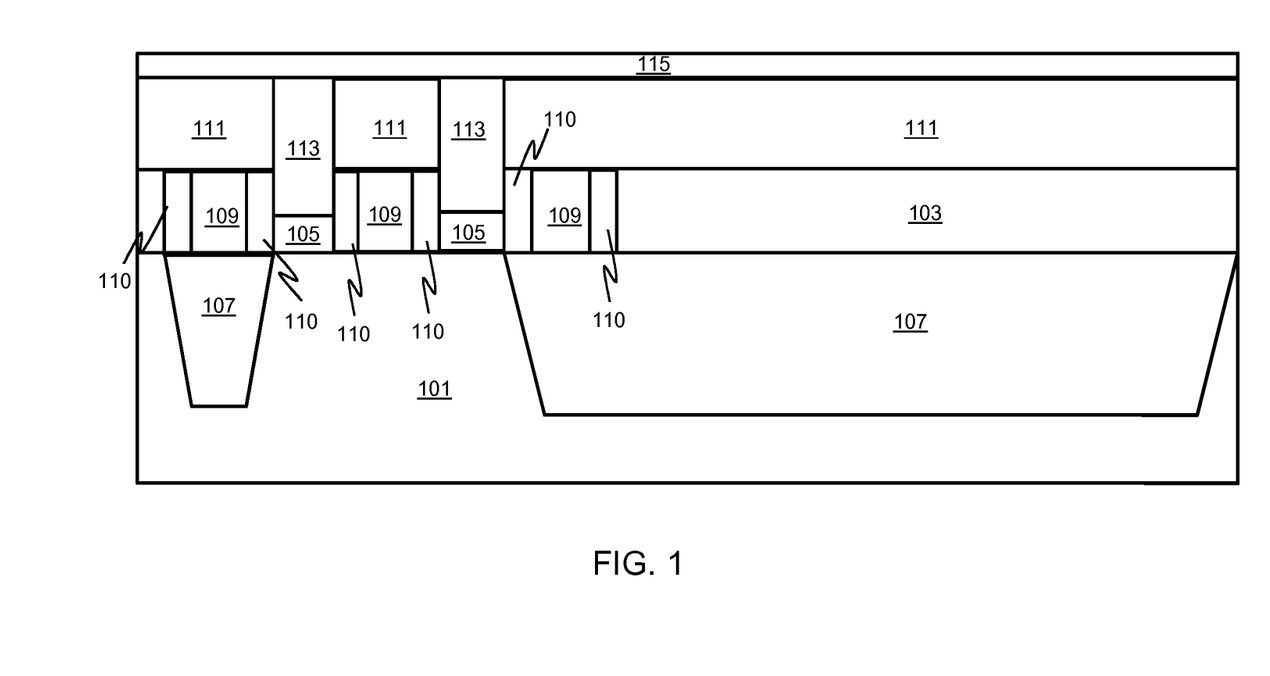
FIGS. 1 through 5 illustrate a process flow of forming a sandwich damascene mono-resistor, in accordance with an exemplary embodiment of the present disclosure.
Figure 2:
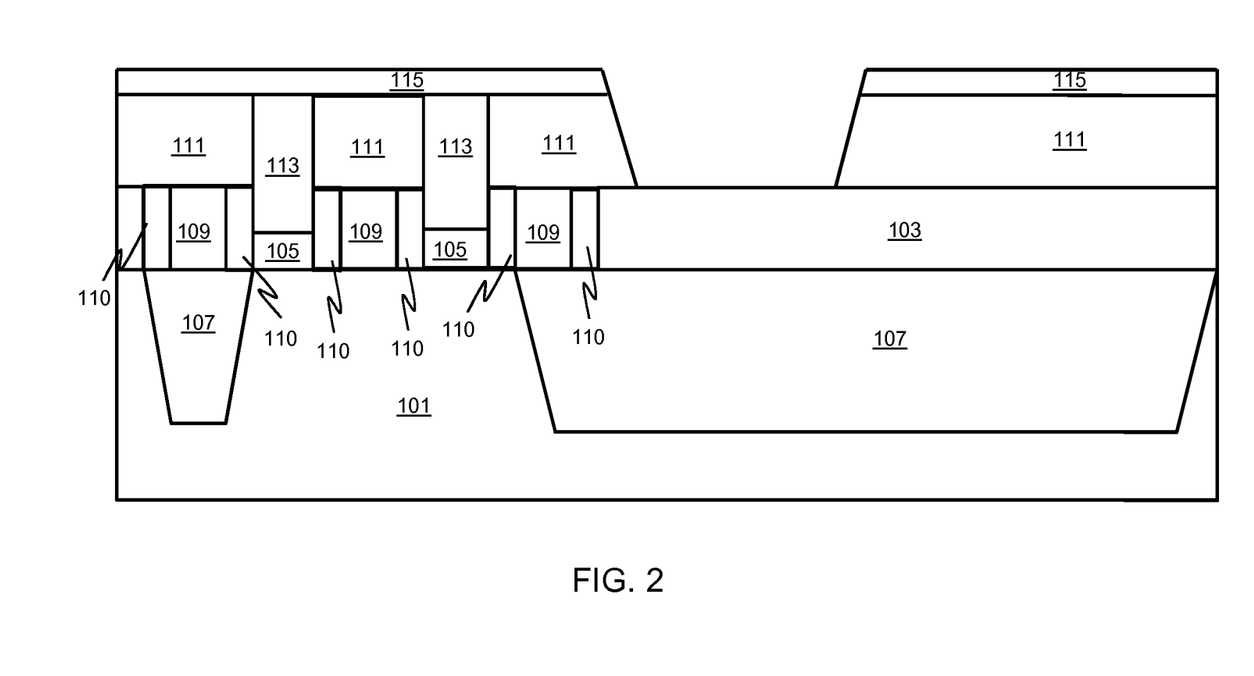
Figure 3:
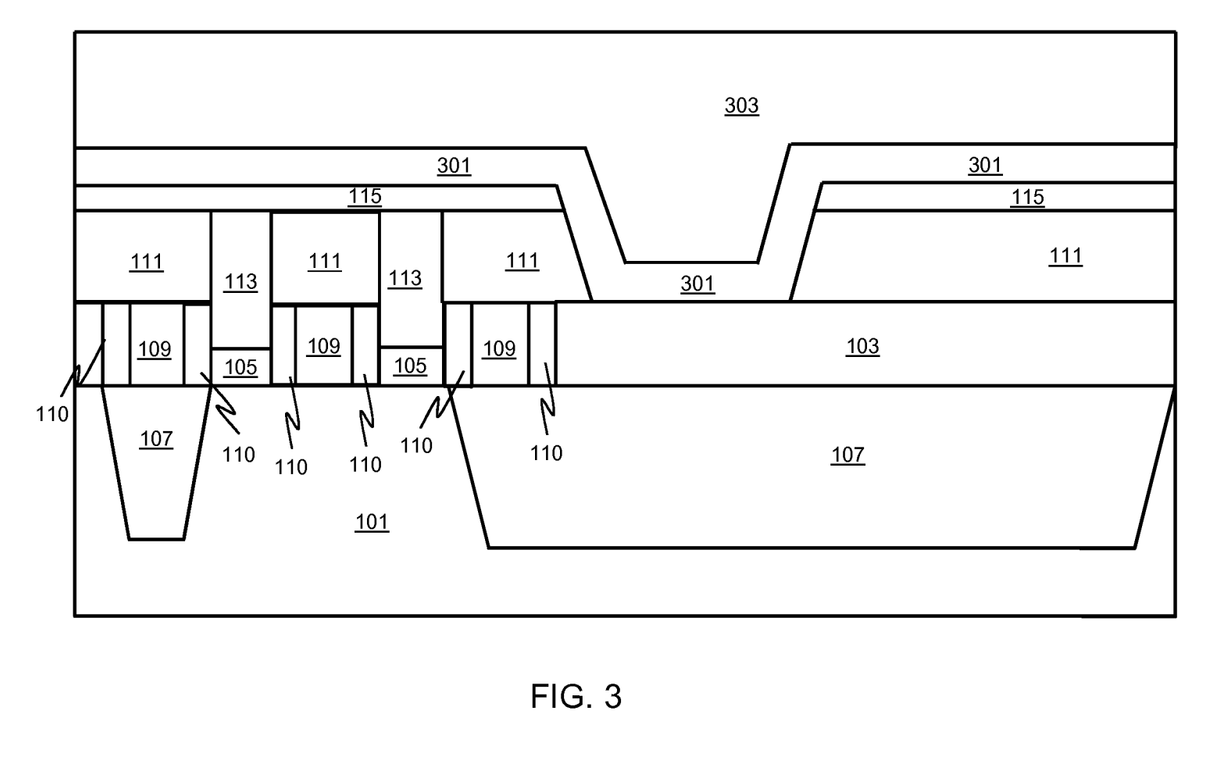

Next, a portion of the SL 115 and the first dielectric layer 111 is removed, for example by damascene etching down to ILD 103, to form a first cavity as illustrated in FIG. 2. The cavity may have a width of 0.3 micrometers (μm) to 20 μm and a length as long as 50 μm. Subsequently, a layer of resistive material 301 is conformally formed in the first cavity and over the SL 115 to a thickness of 10 nm to 25 nm, as illustrated in FIG. 3. The resistive material may include TaSi$N_x$, polysilicon (doped or undoped), TiN, TaN, WSi$_x$, NiCr, TiNxOy, RuO/TaN stack, TaCxNy, TaSiC, SiC, CrSi2, CrSiO, or CrxSiyNz. The exact thickness of the SL 115 and the resistive material 301 depends on the CMP process margin and technology nodes. As the dimensions of the technology nodes scale down, the thickness of the SL 115 and the resistive material 301 decreases. For example, with respect to 20 nm nodes, the SL 115 may be formed to a thickness of 10 nm to 20 nm and the resistive material 301 may be formed to a thickness of 20 nm to 30 nm. Thereafter, a sacrificial dielectric layer 303, for example of an oxide, e.g., $SiO_2$, or a nitride, is deposited over the layer of the resistive material 301 and filling the first cavity.

Figure 4:
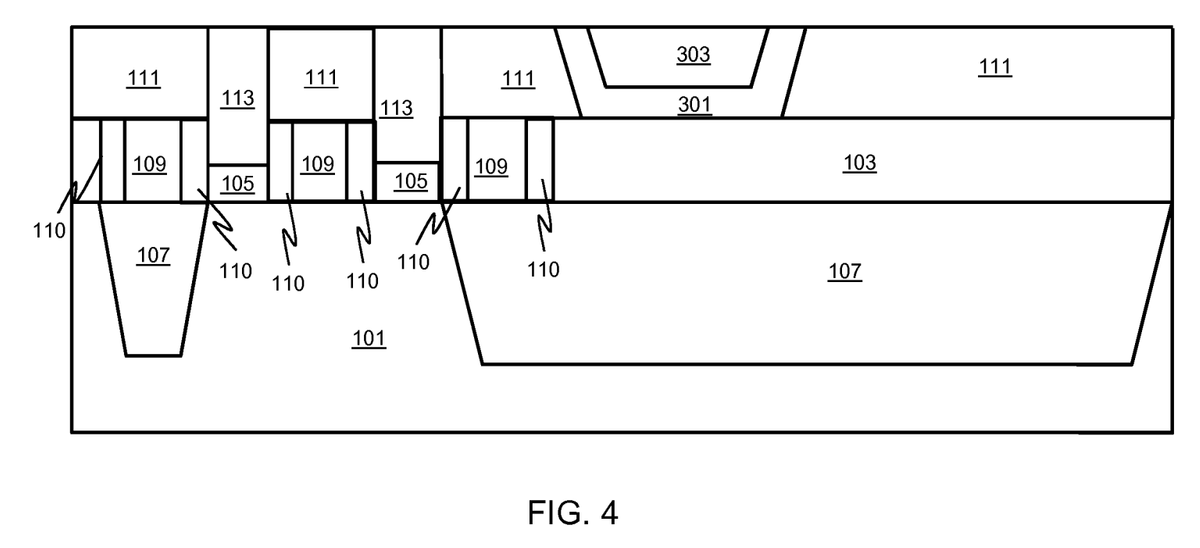

As illustrated in FIG. 4, the second dielectric layer 303 and the layer of resistive material 301 not in the first cavity and at least a partial depth of the SL 115 are removed by CMP. FIG. 4 shows the SL 115 completely removed, but 10 nm to 30 nm of the SL 115 (not shown for illustrative convenience) may remain after CMP. Adverting to FIG. 5, a fourth dielectric layer 501, e.g., of oxide or nitride, is formed over the first dielectric layer 111, the trench silicide 113, the resistive material 301, and the second dielectric layer 303. Thereafter, source/drain contacts 503 (CA) and gate contacts 505 (CB) are formed through the dielectric layer 501, the second dielectric layer 303, and the first dielectric layer 111, down to the trench silicide 113, the RMGs 109, and the resistive material 301, respectively.

FIGS. 6A through 10A and 6B through 10B illustrate alternative process flows for forming sandwich damascene hybrid resistors, in accordance with exemplary embodiments. Adverting to FIG. 6A, following the removal of the entire depth of the SL 115 as depicted in FIG. 4, a second SL 601 is formed to a thickness of 20 nm to 40 nm over the first dielectric layer 111, the trench silicide 113, the resistive material 301, and the second dielectric layer 303

Figure 7A:
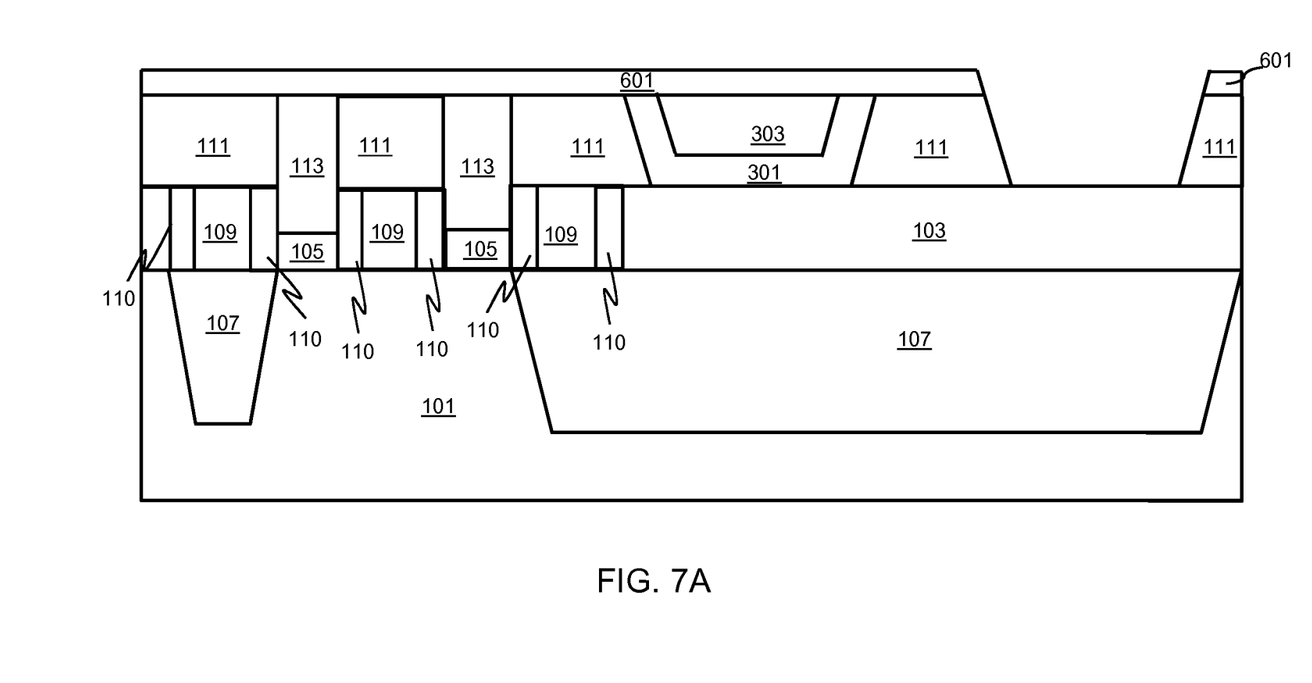
Figure 8A:
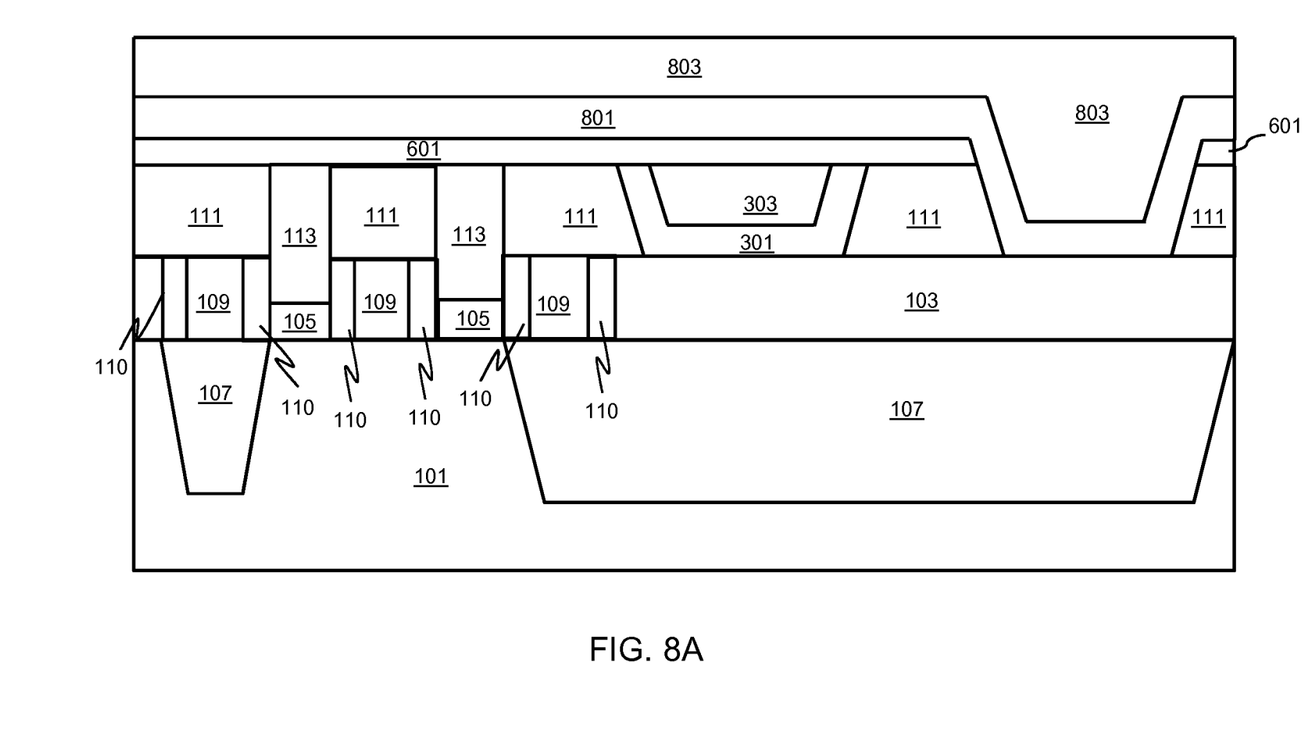

Next, similar to FIG. 2, a portion of the second SL 601 and the first dielectric layer 111 are removed by damascene etching down to dielectric layer 103 to form a second cavity as illustrated in FIG. 7A. The cavity may have a width of 0.3 µm to 20 µm and a length as long as 50 µm. Then, a layer of second resistive material 801 is conformally formed to a thickness of 10 nm to 25 nm in the second cavity and over the second SL 601 as illustrated in FIG. 8A. For example, the layer of second resistive material 801, like the layer of first resistive material 301, may be formed from $TaSiN_x$, polysilicon (doped or undoped), TiN, TaN, $WSi_x$, NiCr, TiNxOy, RuO/TaN stack, TaCxNy, TaSiC, SiC, CrSi2, CrSiO, or CrxSiyNz. However, the layer of second resistive material 801 may be formed to a different thickness and of a different material than the layer of first resistive material 301. Thereafter, a third dielectric layer 803, for example of an oxide, e.g., $SiO_2$, or nitride is deposited over the layer of second resistive material 801 and filling the second cavity.

FIGS. 6B through 10B illustrate an exemplary embodiment in which a part of SL layer 115' remains after the CMP described with respect to FIG. 4. Adverting to FIG. 6B, to form sandwich hybrid resistors in accordance with this embodiment, a thicker SL layer is required as compared with forming sandwich damascene mono resistors. For example, the SL layer 115' is formed to a thickness of 30 nm to 50 nm instead of forming the SL 115 to a thickness of 20 nm to 40 nm. After a partial depth of the SL 115' is removed by CMP in FIG. 4, a thickness of 20 nm to 30 nm remains on top of the first dielectric 111 and the trench silicide 113.

Figure 7B:
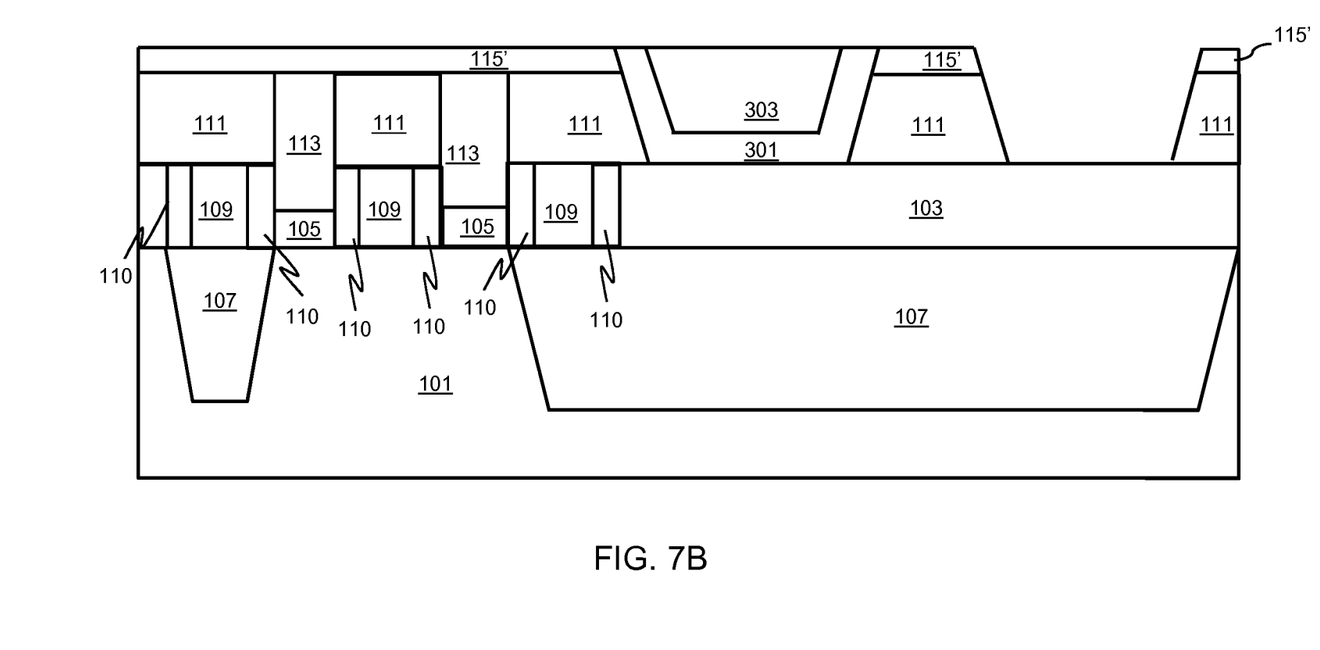
Figure 8B:
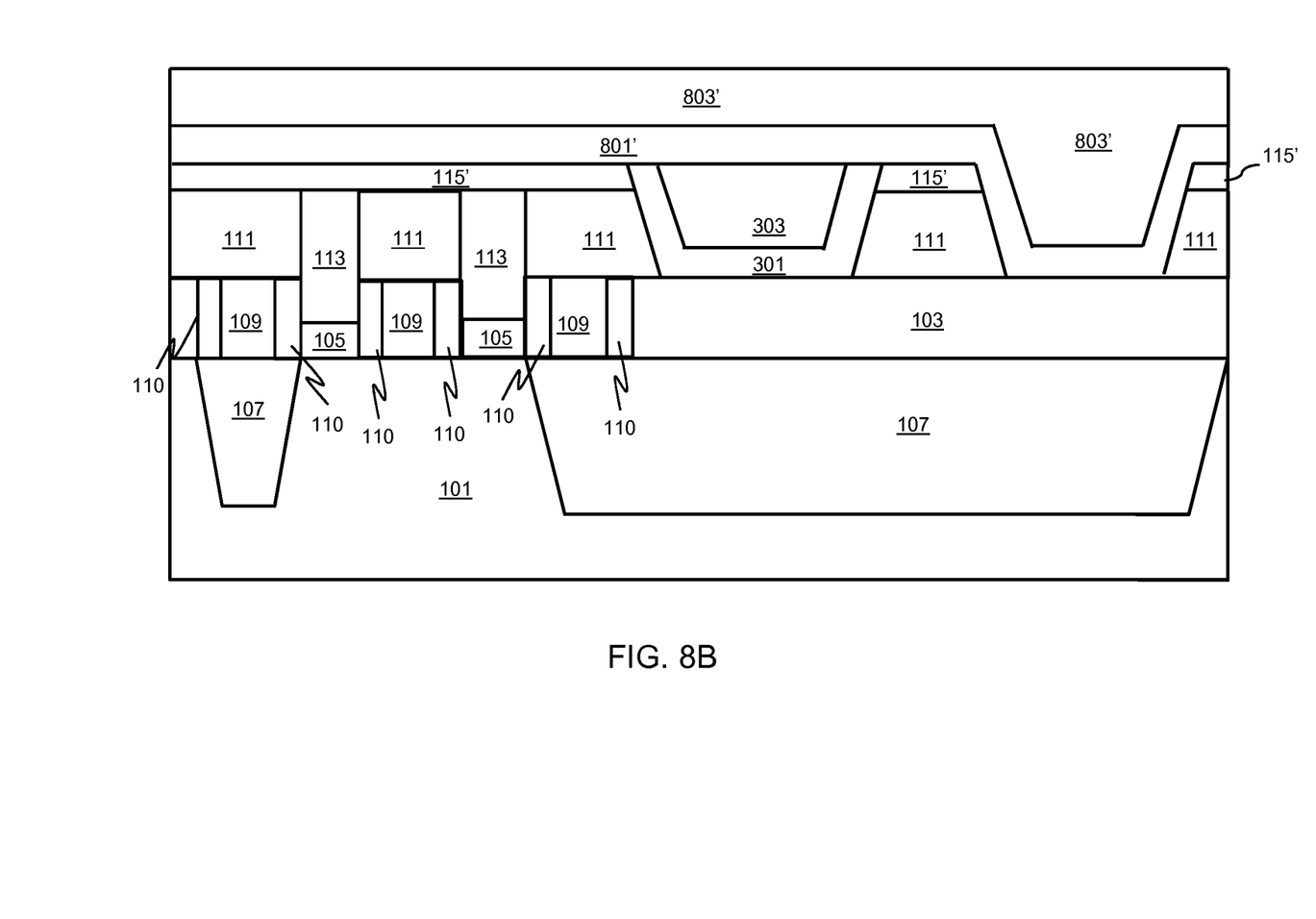

Next, a second portion of the SL 115' and the first dielectric layer 111 are removed by damascene etching down to dielectric layer 103 to form a second cavity as illustrated in FIG. 7B. Then, a layer of second resistive material 801' is conformally formed to a thickness of 10 nm to 25 nm in the second cavity and over the SL 115' as illustrated in FIG. 8B. For example, the layer of second resistive material 801', like the layer of first resistive material 301, may be formed of $TaSiN_x$, polysilicon (doped or undoped), TiN, TaN, $WSi_x$, NiCr, TiNxOy, RuO/TaN stack, TaCxNy, TaSiC, SiC, CrSi2, CrSiO, or CrxSiyNz. Similar to the second resistive layer 801, the layer of second resistive material 801' may be a different thickness and a different material than the layer of first resistive material 301. Thereafter, a third dielectric layer 803', for example of an oxide, e.g., $SiO_2$, or nitride, is deposited over the layer of second resistive material 801' and filling the second cavity.

Figure 9A:
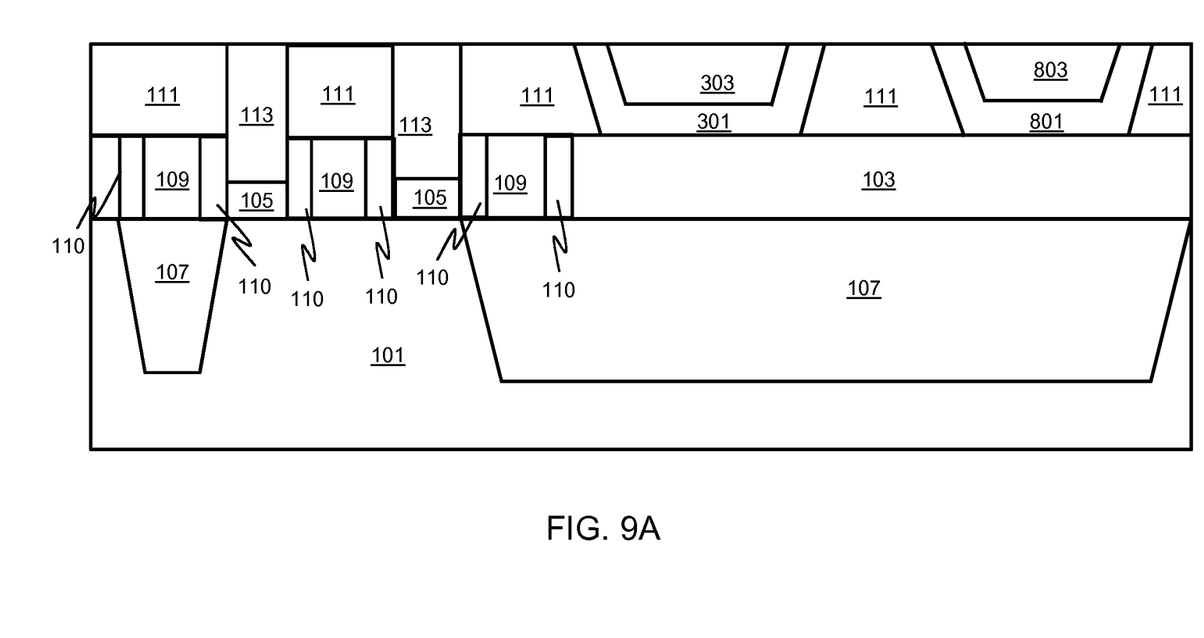
Figure 9B:
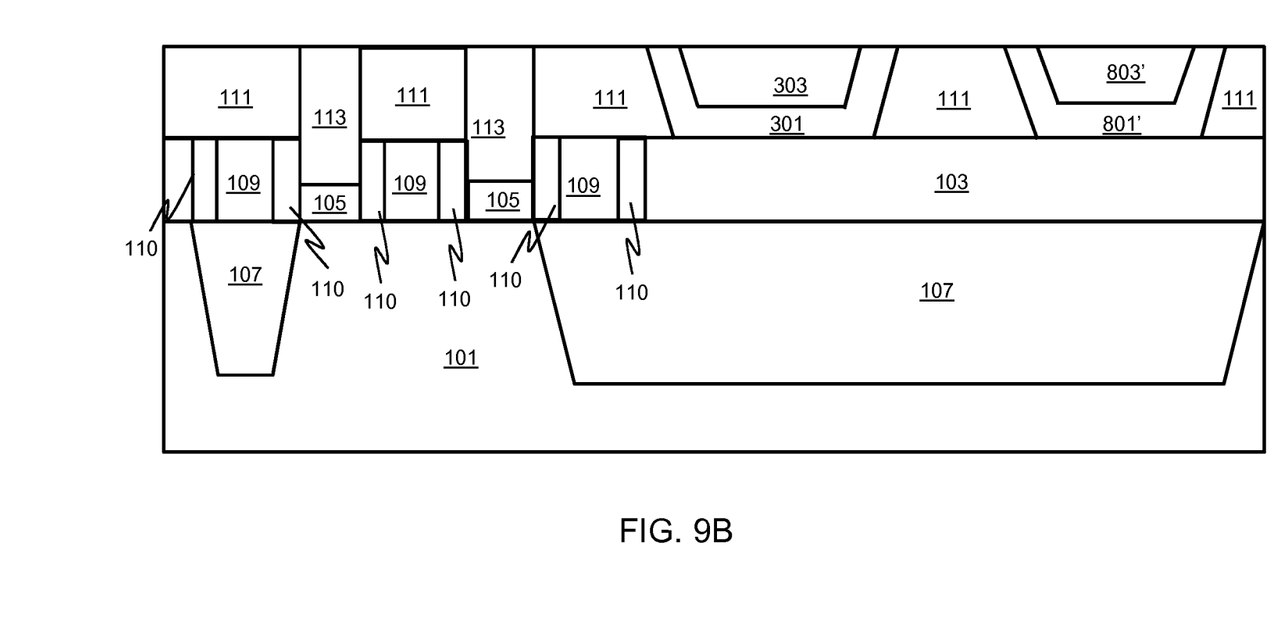

Adverting to FIG. 9A, the third dielectric layer 803, the layer of second resistive material 801 not in the second cavity, and the second SL 601 are removed by CMP. Likewise, as illustrated in 9B, the third dielectric layer 803', the layer of second resistive material 801' not in the second cavity, the SL 115', and a portion of the second dielectric layer 303 and the layer of first resistive material 301 are removed by CMP down to the upper surface of the first dielectric layer 111.

Figure 5:
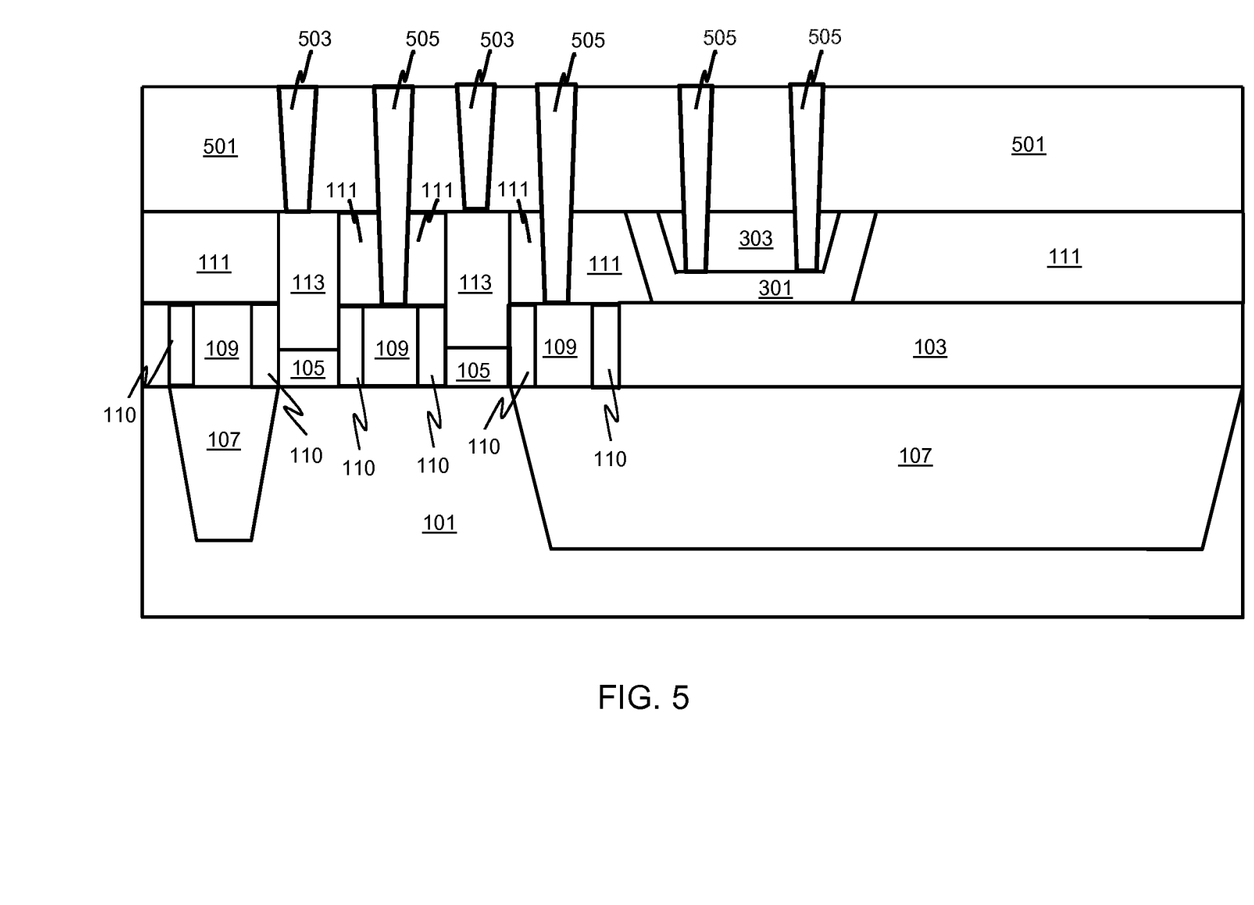
Figure 6A:
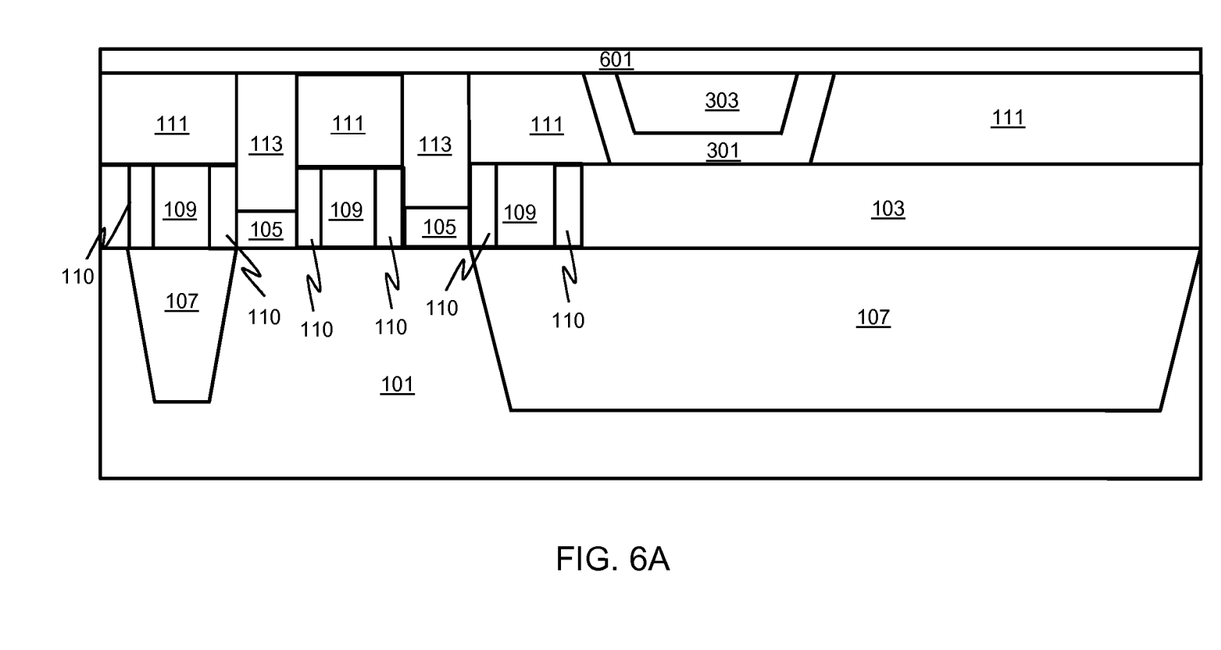
Figure 6B:
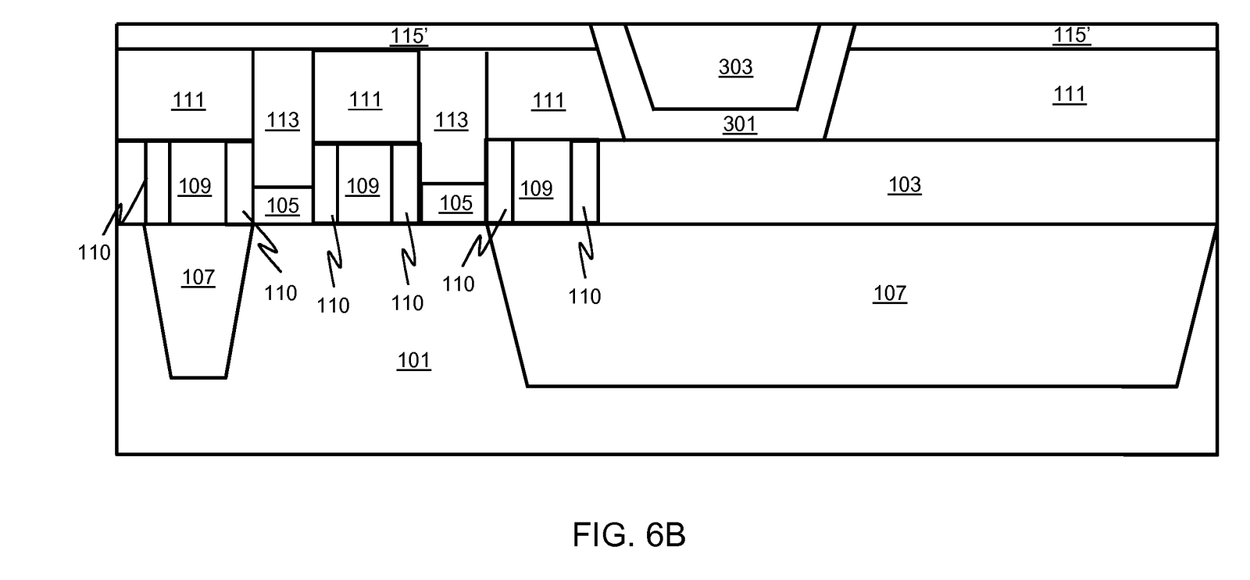
Figure 10A:
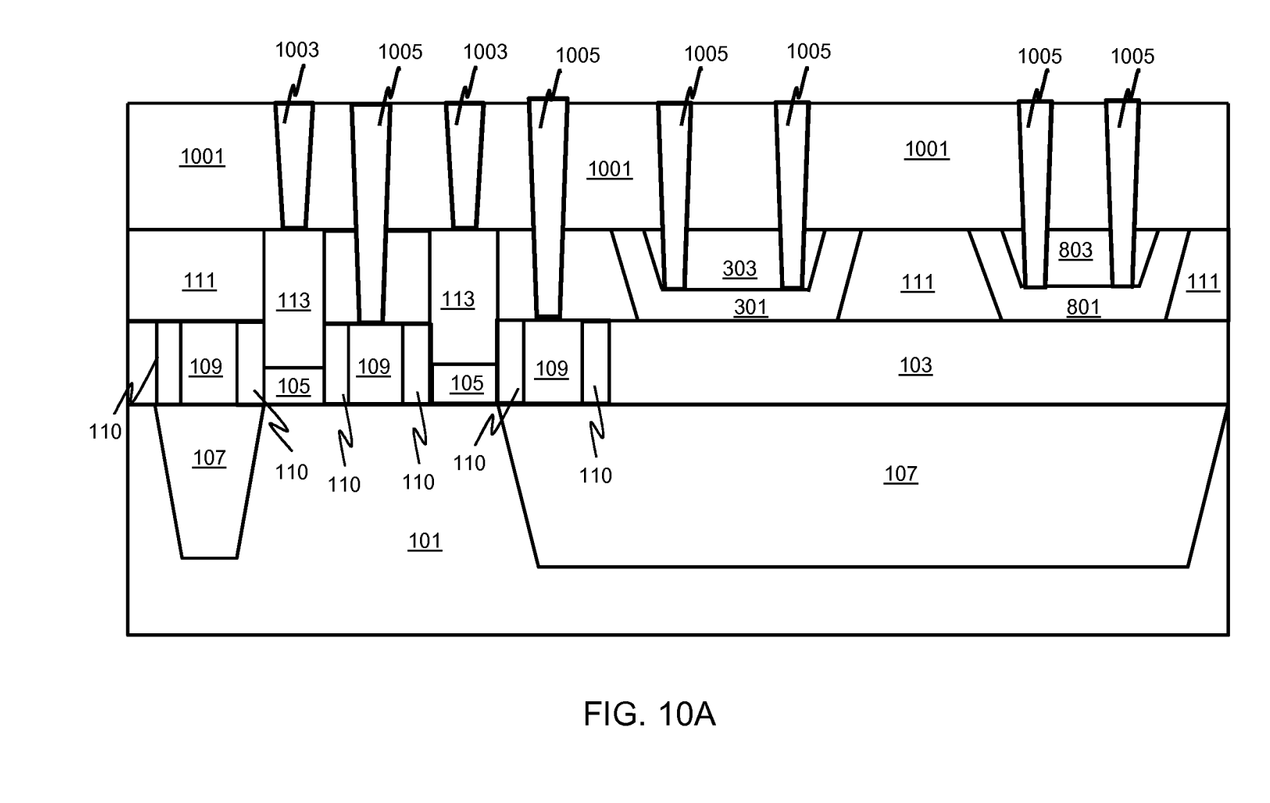

Adverting to FIG. 10A, similar to FIG. 5, a fourth dielectric layer 1001, for example of oxide or nitride, is formed on top of the first dielectric layer 111, the trench silicide 113, the layer of first resistive material 301, the second dielectric layer 303, the layer of second resistive material 801, and the third dielectric layer 803. Thereafter, source/drain contacts 1003 are formed through the fourth dielectric layer 1001 down to the trench silicide 113, and gate contacts 1005 are formed through the fourth dielectric layer 1001 down to the RMGs 109, the layer of first resistive material 301, and the layer of second resistive material 801.

Figure 10B:
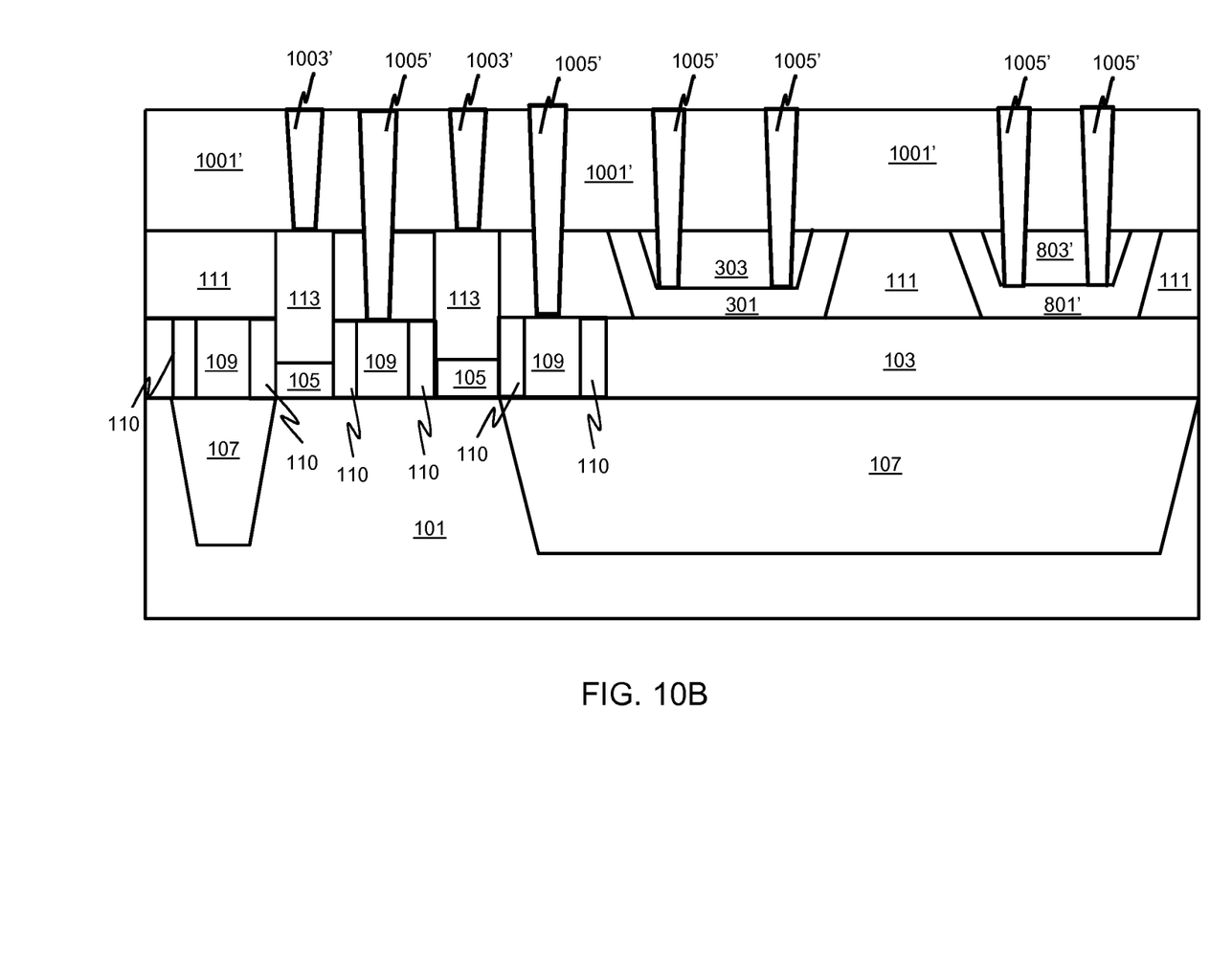

Similarly, as illustrated in FIG. 10B, a fourth dielectric layer 1001', for example of oxide or nitride, is formed on top of the first dielectric layer 111, the trench silicide 113, the layer of first resistive material 301, the second dielectric layer 303, the layer of second resistive material 801', and the third dielectric layer 803'. Thereafter, source/drain contacts 1003' are formed through the fourth dielectric layer 1001' down to the trench silicide 113, the layer of first resistive material 301, and the layer of second resistive material 801', and gate contacts 1005' are formed through the fourth dielectric layer 1001' down to the RMGs 109.

The embodiments of the present disclosure can achieve several technical effects including integration with current MOL process, meeting tightened W CA/CB CMP margin, enabling integration of various resistor materials, reducing the CMP impacts on the resistive materials, and enabling easy trench depth control, easy etch selectivity, and lower etch macro loading. The present disclosure enjoys industrial applicability in any of various types of highly integrated semiconductor devices particularly for 20 nm and 22 nm technology nodes, and below nodes.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   a substrate;
   an interlayer dielectric (ILD) on the substrate;
   a first dielectric layer on the (ILD);
   a first cavity formed in the first dielectric layer;
   a layer of resistive material lining a bottom of the first cavity;
   a second dielectric layer atop the layer of resistive material and filling the first cavity;
   a second cavity formed in the first dielectric layer;
   a layer of second resistive material lining the second cavity; and
   a third dielectric layer filling the second cavity.

2. The device according to claim 1, further comprising forming at least one replacement metal gate (RMG) on the substrate in the ILD.

3. The device according to claim 1, wherein the first dielectric layer comprises an oxide or a nitride.

4. The device according to claim 1, wherein the first dielectric layer has a thickness of 30 nm to 50 nm.

5. The device according to claim 4, wherein the layer of resistive material has a thickness of 10 nm to 25 nm.

6. The device according to claim 1, wherein the layer of resistive material comprises tantalum silicon nitride (TaSiNx), polysilicon (doped or undoped), titanium nitride (TiN), tantalum nitride (TaN), tungsten silicide (WSix), nickel-chromium (NiCr), titanium oxynitride (TiNxOy), ruthenium monoxide (RuO)/TaN stack, tantalum carbonitride (TaCxNy), tantalum silicon carbide (TaSiC), SiC, chromium silicide (CrSi2), chromium silicon monoxide (CrSiO), or chromium-silicon-nitrogen (CrxSiyNz).

7. The device according to claim 1, further comprising:
a second cavity formed in the first dielectric layer.

8. The device according to claim 7, further comprising:
a layer of second resistive material lining the second cavity.

9. The device according to claim 8, further comprising:
a third dielectric layer atop the layer of second resistive material and filling the second cavity.

10. A device comprising:
a substrate;
at least one pair of source/drain regions in the substrate;
an interlayer dielectric (ILD) on the substrate;
a replacement metal gate (RMG) on the substrate in the ILD between each pair of source/drain regions;
a first cavity formed through a first dielectric layer and a first sacrificial layer (SL) on the ILD and RMGs;
a layer of first resistive material in the first cavity;
a second dielectric layer over the layer of first resistive material and filling the first cavity, wherein the ILD is different from the first dielectric layer;
a second cavity in the first dielectric layer; and
a layer of second resistive material lining the second cavity.

11. The device according to claim 10, further comprising:
a third dielectric layer over the layer of second resistive material and filling the second cavity.

12. The device according to claim 11, further comprising:
a fourth dielectric layer formed over the entire substrate; and
contacts formed through the fourth dielectric layer and through the second and third dielectric layers to the layer of first resistive material and the layer of second resistive material, respectively, forming source/drain contacts through the fourth dielectric layer to the source/drain regions, and forming gate contacts through the fourth dielectric layer to the RMGs.

* * * * *